(12) United States Patent
Choi (10) Patent No.: US 8,774,570 B2
(45) Date of Patent: Jul. 8, 2014

(54) OPTICAL PRINTED CIRCUIT BOARD AND METHOD FOR MANUFACTURING THE SAME

(75) Inventor: Jae Bong Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 44 days.

(21) Appl. No.: 13/501,003

(22) PCT Filed: Mar. 18, 2010

(86) PCT No.: PCT/KR2010/001684
§ 371 (c)(1),
(2), (4) Date: Apr. 9, 2012

(87) PCT Pub. No.: WO2011/043520
PCT Pub. Date: Apr. 14, 2011

(65) Prior Publication Data
US 2012/0201493 A1   Aug. 9, 2012

(30) Foreign Application Priority Data
Oct. 9, 2009   (KR) ................... 10-2009-0096271

(51) Int. Cl.
*G02B 6/12*   (2006.01)
*H04B 10/12*   (2006.01)

(52) U.S. Cl.
USPC ............................................. 385/14; 398/141

(58) Field of Classification Search
None
See application file for complete search history.

(56) References Cited

U.S. PATENT DOCUMENTS

| 6,243,509 B1 | 6/2001 | Chen |
| 2002/0141707 A1 | 10/2002 | Shin |
| 2002/0196997 A1 * | 12/2002 | Chakravorty et al. ......... 385/14 |
| 2004/0156576 A1 | 8/2004 | Windover |
| 2005/0089276 A1 | 4/2005 | Yoon et al. |
| 2006/0056765 A1 | 3/2006 | Hwang et al. |
| 2008/0008477 A1 | 1/2008 | Ogawa |
| 2009/0169219 A1 | 7/2009 | Nakano et al. |
| 2009/0214158 A1 | 8/2009 | Lee et al. |
| 2009/0274412 A1 | 11/2009 | Sano et al. |

FOREIGN PATENT DOCUMENTS

| CN | 101421651 A | 4/2009 |
| EP | 1980886 A2 | 10/2008 |
| JP | 2008-015336 A | 1/2008 |
| JP | 2009-139758 | 6/2009 |

(Continued)

OTHER PUBLICATIONS

Office Action dated Mar. 16, 2011 in Korean Application No. 10-2009-0096271, filed Oct. 9, 2009.

(Continued)

*Primary Examiner* — Jerry Rahll
(74) *Attorney, Agent, or Firm* — Saliwanchik, Lloyd & Eisenschenk (57) ABSTRACT

Provided are an optical printed circuit board and a method for manufacturing the same. The optical printed circuit board includes a printed circuit board and an optical connecting module. The printed circuit board is provided with at least one or more inner layers, and a circuit pattern electrically connecting the inner layers. The optical connecting module is embedded in the printed circuit board and includes an optical transmitting portion, an optical receiving portion, and an optical waveguide connecting the optical transmitting portion and the optical receiving portion. The printed circuit board defines an align pattern region, such that tops of the optical transmitting portion and the optical receiving portion are formed lower than a surface of the printed circuit board.

12 Claims, 5 Drawing Sheets

(56) References Cited

FOREIGN PATENT DOCUMENTS

| | | |
|---|---|---|
| KR | 10-2006-0118647 A | 11/2006 |
| KR | 10-2009-0032623 A | 4/2009 |
| KR | 10-2009-0089668 A | 8/2009 |
| KR | 10-2009-0095841 A | 9/2009 |
| WO | WO-2007/114384 A1 | 10/2007 |

OTHER PUBLICATIONS

International Search Report in International Application No. PCT/KR2010/001684, filed Mar. 18, 2010.

Office Action dated Mar. 18, 2013 in Taiwanese Application No. 099108147, filed Mar. 19, 2010.

Office Action dated Jun. 4, 2013 in Chinese Application No. 201080056253.0, filed Mar. 18, 2010.

Office Action dated Aug. 13, 2013 in Japanese Application No. 2012-533059, filed Mar. 18, 2010.

Office Action dated Apr. 22, 2014 in Japanese Application No. 2012-533059.

* cited by examiner

Figure 1

Prior Art

OPTICAL PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2010/001684, filed Mar. 18, 2010, which claims priority to Korean Application No. 10-2009-0096271, filed Oct. 9, 2009 the disclosures of each of which are incorporated herein by reference in their entirety.

TECHNICAL FIELD

The present application claims priority of Korean Patent Application No. 10-2009-0096271 filed on Oct. 9, 2009, which is hereby incorporated by reference in its entirety.

The present invention relates to an optical printed circuit board and a method for manufacturing the same.

BACKGROUND ART

Typically used printed circuit boards (PCBs) have a substrate on which a copper thin film circuit is formed and which is coated, and then has various components inserted therein and is operated through transmission of electrical signals. Such typical printed circuit boards, however, have the limitation of the substrate having a lower capacity for transmitting electrical signals than the processing ability of the components, or electrical devices. In particular, such electrical signals are sensitive to the external environment, and noise is generated, thus presenting considerable obstacles for electronic products requiring high precision. To alleviate such limitations, instead of a metallic circuit such as copper, an optical printed circuit board using an optical waveguide has been developed with greater reduction of electrical wave interference and noise, to allow production of high precision, advanced equipment.

Figure 1:
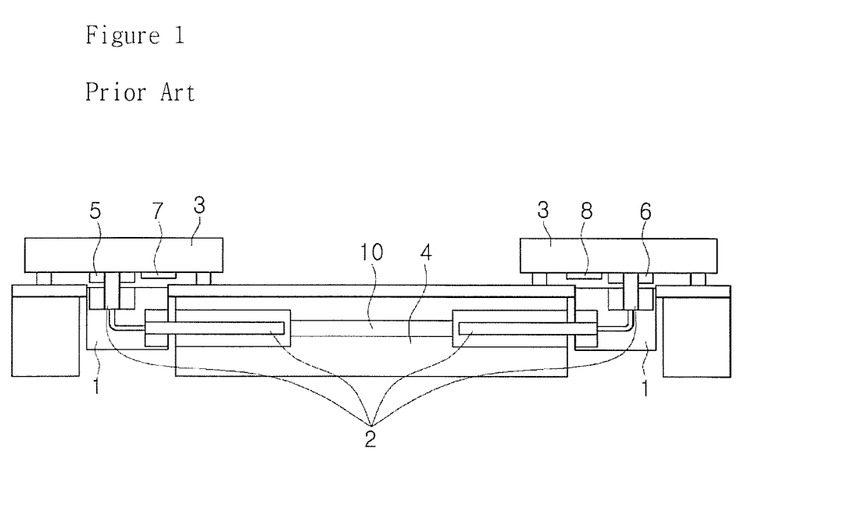
FIG. 1 is a conceptual view showing the structure of an optical printed circuit board according to the related art.

FIG. 1 is a conceptual view showing the structure of an optical printed circuit board according to the related art.

Referring to FIG. 1, an optical printed circuit board according to the related art, for achieving an optical connection, includes a light emitting device 5, a transmission processing chip 7, a light collecting device 6, a reception processing chip 8, an optical connecting block 1, and an optical waveguide 10.

Specifically, a printed circuit board 3 is provided to mount the light emitting device 5, transmission processing chip 7, light collecting device 6, and reception processing chip 8, and a guide pin 2 provides connections between the optical connecting block 1 and the optical printed circuit board 4, between the optical connecting block 1 and the light emitting device 5 and the light collecting device 6.

However, in this related art optical printed circuit board, noise can be generated in the line connecting electrical signals between the printed circuit board 3 and the optical printed circuit board 4, and optical loss can occur from misalignment at a portion connecting the light emitting device 5 and light collecting device with the optical connecting block 1, or at a portion connecting the optical connecting block 1 with the optical waveguide 2 inside the optical printed circuit board 4.

Also, when the guide pin 2 is used, the guide pin 2 may be dislodged or deformed from vibrations or temperature variation during use.

DISCLOSURE OF INVENTION

Technical Problem

Embodiments provide an optical printed circuit board with a novel structure, and a method for manufacturing the same.

Embodiments also provide an optical printed circuit board with easy alignment between an optical connecting module and transmission module and a reception module, and a method for manufacturing the same.

Embodiments further provide an optical printed circuit board capable of firmly coupling an optical connecting module and a transmission module and a reception module, and a method for manufacturing the same.

Technical Solution

In one embodiment, an optical printed circuit board includes: a printed circuit board provided with at least one or more inner layers, and a circuit pattern electrically connecting the inner layers; and an optical connecting module embedded in the printed circuit board and including an optical transmitting portion, an optical receiving portion, and an optical waveguide connecting the optical transmitting portion and the optical receiving portion, wherein the printed circuit board defines an align pattern region, such that tops of the optical transmitting portion and the optical receiving portion are formed lower than a surface of the printed circuit board.

In another embodiment, a method for manufacturing an optical printed circuit board includes: a first step of forming a base inner layer on an insulation layer, the base inner layer having a circuit pattern formed thereon; a second step of processing the base inner layer or an inner layer on the base inner layer, and positioning an optical connecting module in a defined cavity; a third step of forming at least one or more electrically interconnected inner layers on a region other than the optical connecting module; and a fourth step of selectively removing a surface of an outermost inner layer from among the at least one or more inner layers, and forming an align pattern region.

Advantageous Effects

Embodiments can provide an optical printed circuit board with a novel structure, and a method for manufacturing the same.

Embodiments can also provide an optical printed circuit board with easy alignment between an optical connecting module and transmission module and a reception module, and a method for manufacturing the same.

Embodiments can further provide an optical printed circuit board capable of firmly coupling an optical connecting module and a transmission module and a reception module, and a method for manufacturing the same.

MODE FOR THE INVENTION

Hereinafter, embodiments will be described in detail with reference to accompanying drawings. In the description referring to the accompanying drawings, irrespective of the reference numerals, like elements will be given like reference numerals, and repetitive description thereof will not be provided. While terms such as "first", "second", etc. may be used to describe various elements, the elements shall not be limited by such terms. These terms are used only to distinguish one element from another.

The present invention provides an optical connecting module formed integrally with an optical printed circuit board, where the optical connecting module is embedded in the printed circuit board, and an exposed portion of the optical connecting module is formed lower than the surface of the printed circuit board, so that mechanical reliability of the overall optical connecting system can be secured, and transmitted/received noise can be removed.

Figure 2:
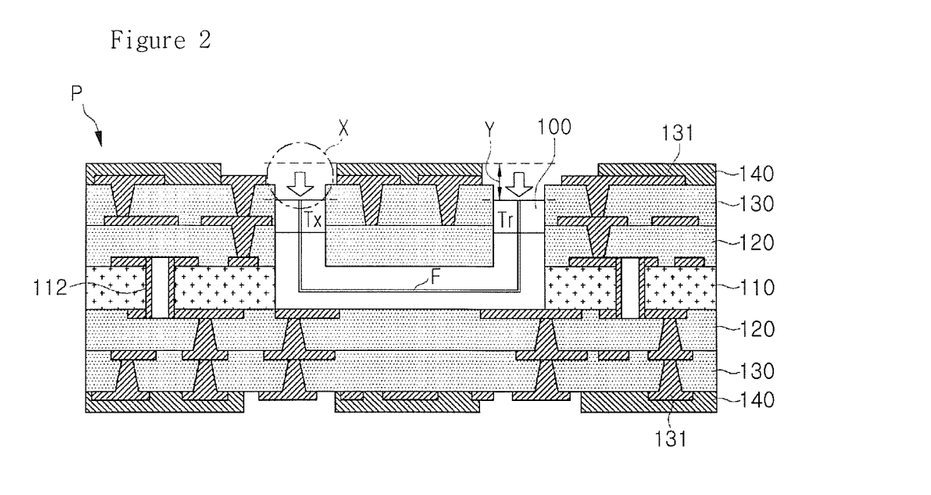
FIGS. 2 and 3 are sectional views schematically showing main elements of an optical printed circuit board according to embodiments.

FIG. 2 is a sectional view showing the inside of an optical printed circuit board according to an embodiment.

An optical printed circuit board P according to an embodiment includes at least one or more inner layers 110, 120, and 130, and a circuit pattern 131 electrically connecting the inner layers 110, 120, and 130.

The optical printed circuit board P includes an optical connecting module 100 having an optical transmitting portion Tx, an optical waveguide F, and an optical receiving portion Tr, and an align pattern region X is formed exposed on a portion of the optical connecting module 100 on the optical printed circuit board P.

In particular, with regard to the positioning of the optical connecting module 100 according to embodiments, a partial surface of the optical connecting module 100 is exposed on the align pattern region X which is lower than the surface of the optical printed circuit board P. Accordingly, the align pattern region X is configured to be recessed as a stepped pattern that is lower than the surface of the optical printed circuit board P.

In further detail, the inner layers 110, 120, and 130 may be formed as individual layers or a plurality of layers in the optical printed circuit board P according to embodiments, and a structure provided with a plurality of layers will be described in embodiments.

The inner layers 110, 120, and 130 are connected through a structure with a base inner layer 110, and at least one or more inner layers 120 and 130 electrically conducted at the top or/and bottom of the base inner layer 110, through a bump or conductive through-hole 112. The optical connecting module 100 is formed on the base inner layer 110 and the other inner layers 120 and 130.

The optical connecting module 100 is formed integrally with an optical transmitting portion Tx and an optical receiving portion Tr, and an optical waveguide F that connects the optical transmitting portion Tx and the optical receiving portion Tr. Also, the exterior of the optical waveguide F may be protected with an external member such as the above supporting member. The optical waveguide F may employ fiber optics to transmit and receive optical signals. In particular, the surfaces of the optical transmitting portion Tx and the optical receiving portion Tr that constitute the ends of the optical connecting module 100 are configured to be exposed outside of the optical printed circuit board P.

Accordingly, the optical connecting module 100 according to embodiments may be provided with an align pattern region X that is lower than the surface of the optical printed circuit board P, and the align pattern region X may have a stepped structure that is recessed below the surface of the optical printed circuit board P.

The align pattern region X is configured as a recessed space so that the surfaces of the optical transmitting portion Tx and the optical receiving portion Tr that are formed at either end of the optical connecting module 100 mounted in embedded form in the optical printed circuit board P are exposed, and may have a depth Y that is the distance from the outermost surface 140 of the optical printed circuit board P to a portion of the outermost inner layer 130.

In the related art, because a transmitting module and a receiving module are mounted at the same height as or above the surface of the optical printed circuit board, pin hole alignment for fixing guide pins is mandatory, and therefore, misalignment and other defects lead to delays in the manufacturing process. Also, because fixing is performed with guide pins only, the transmitting module and receiving module are weak and reduce the overall mechanical strength of the optical printed circuit board.

When a transmitting module and a receiving module are mounted on the optical transmitting portion Tx and optical receiving portion Tr disposed on the align pattern region X according to the present invention, aligning convenience and mechanical strength may be secured at the same time, and a detailed description thereof will be provided below.

Figure 3:
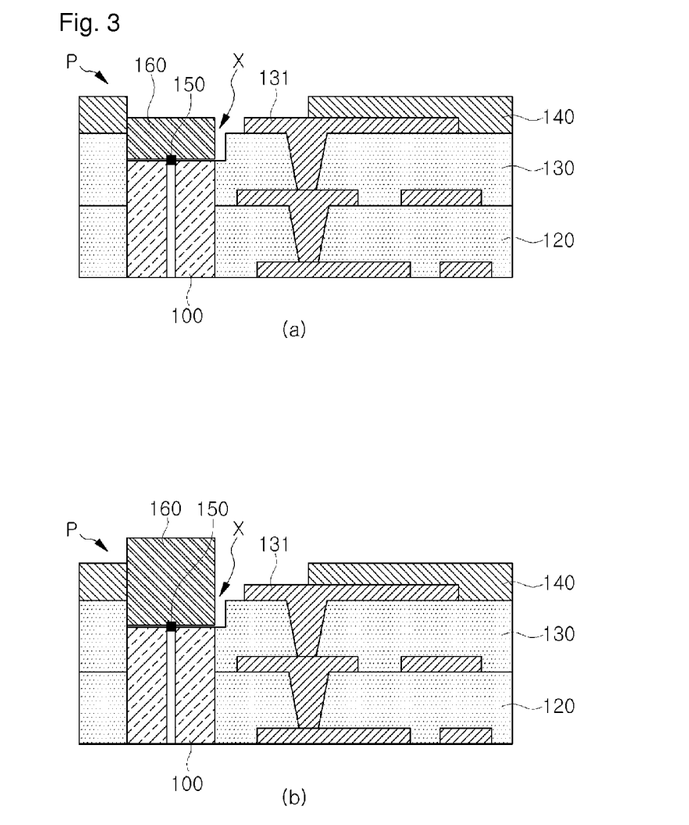

FIG. 3 shows enlarged views of main elements of an align pattern region X according to embodiments.

As shown in FIG. 3a, an align pattern region X according to embodiments is provided in a structure of a recessed pattern stepped lower than the surface of the optical printed circuit board P, and the optical transmitting portion Tx and the optical receiving portion Tr of the optical connecting module 100 are exposed at the lower portion thereof. A transmitting module or a receiving module 160 may be mounted and connected at the optical transmitting portion Tx or the optical receiving portion Tr. Through the stepping of the align pattern region X, the transmitting module or receiving module 160 may also be embedded lower than the surface of the optical printed circuit board P. The transmitting module may be an E/O (Electro Optical) converter, and the receiving module may be an O/E (Optical Electro) converter.

As shown in FIG. 3b, according to the circumstance, only a portion of the transmitting module or receiving module 160 may be disposed in the align pattern region X. That is, the optical connecting module 100 may be mounted lower than the surface of the optical printed circuit board P, a portion of the transmitting module or receiving module 160 may be inserted in the align pattern region X, and a portion of the transmitting module or receiving module 160 may be formed to project from the surface of the optical printed circuit board P.

In any case, the transmitting module or receiving module 160 may be mounted on the stepped region of the align pattern region X without a separate alignment performed, and a further connection by means of an additional guide pin 150 may be made between the optical connecting module 100 and the transmitting module or receiving module 160.

The presence of the align pattern region X, when the transmitting module or receiving module 160 is mounted on the optical transmitting portion Tx and optical receiving portion Tr, eliminates the need for a separate alignment and allows an automatic align function to be implemented for direct insertion in the align pattern region X that is a recessed open region, so that aligning endeavors can be considerably reduced. Therefore, rather than defects arising from the use of guide pins 150 only, a structure may be realized in which a transmitting module or receiving module 160 is embedded in the align pattern region X, which can strengthen the coupling and improve mechanical strength.

Figure 4:
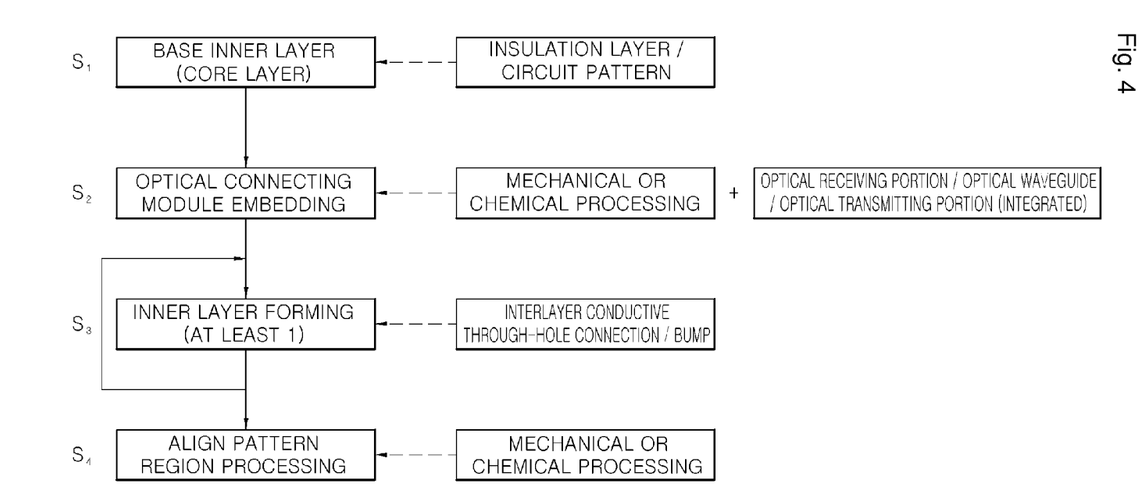
FIGS. 4 and 5 are diagrams showing a process for manufacturing an optical printed circuit board according to embodiments.
Figure 5:
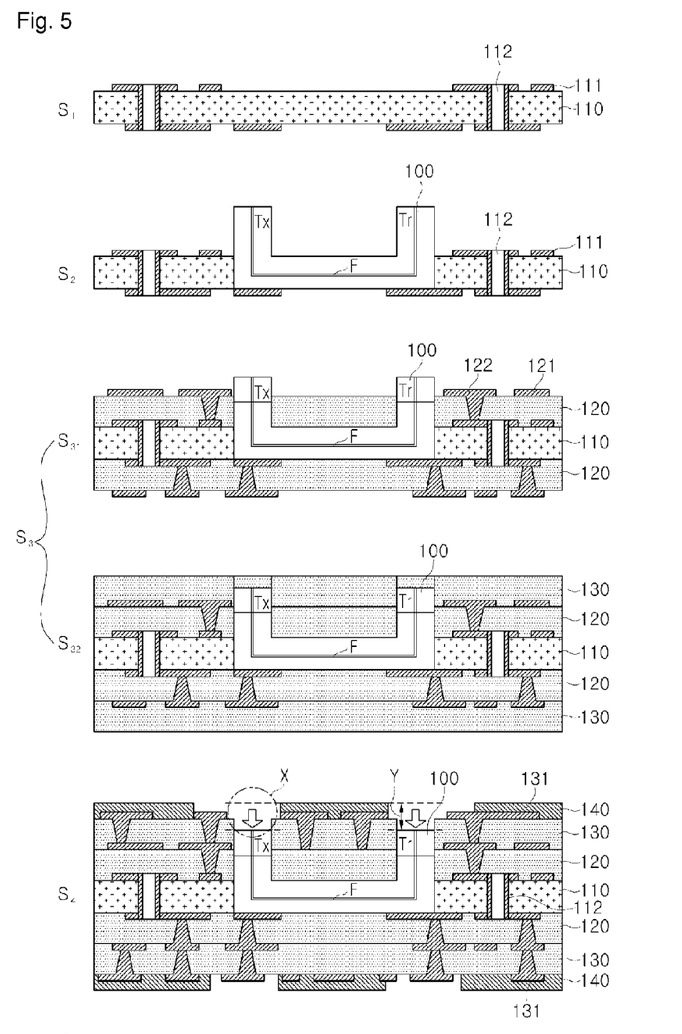

FIGS. 4 and 5 are a flowchart and process diagrams showing a process for manufacturing an optical printed circuit board according to embodiments.

A process for manufacturing an optical printed circuit board according to embodiments includes a first step of forming a base inner layer defining a circuit pattern on an insulation layer, a second step of processing a base inner layer or another inner layer on the base inner layer and embedding an optical connecting module in a defined cavity, a third step of forming at least one or more electrically interconnected inner layers on a region other than the optical connecting module, and a fourth step of processing a surface of the outermost inner layer and forming an align pattern region. In the processing of the embedded pattern in the second step, the base inner layer may be directly processed and formed, or other stacked inner layers may be processed and formed on the top surface of the base inner layer. A description will be given below of an example in which the base inner layer is processed to form an embedded pattern.

The process will be described in further detail below.

First, in the first step S1, a base inner layer 110 is formed to form a core layer. The base inner layer 110 may be formed of an insulation layer, and a conductive through-hole 112 and circuit pattern 111 are formed in the insulation layer to electrically connect to another inner layer.

In the second step, the base inner layer 110 is selectively removed through a mechanical or chemical process to define a cavity in which the optical connecting module 100 may be embedded, and the optical connecting module 100 is embedded in the cavity. The optical connecting module 100 includes an optical transmitting portion Tx, an optical receiving portion Tr, and an optical waveguide F. The optical transmitting portion Tx, optical receiving portion Tr, and optical waveguide F of the optical connecting module 100 may be integrally formed, and a case may be formed as a supporting unit on a portion of the optical connecting module 100. The mechanical processing for defining the cavity may employ a process such as drilling using a laser drill, and the chemical processing for defining the cavity may employ a patterning method using photolithography.

In the third step, at least one or more inner layers 120 and 130 are formed on regions other than the portion at which the optical connecting module 100 is formed. Of the one or more inner layers 120 and 130, the inner layer 120 is deposited on the upper portion of the base inner layer 110, and a copper (Cu) layer is processed to form a circuit pattern 121 in step S31. The inner layer 130 may also be deposited to form a circuit pattern in step S32. This forming of the inner layers 120 and 130 may, of course, be performed repeatedly to yield a stack of multiple layers. However, in order for the transmitting portion Tx and receiving portion Tr, which are the ends of the optical connecting module 100, to be inserted in the outermost inner layer 130, the outermost inner layer 130 is formed higher than the height of the optical connecting module 100 in step S3.

In the fourth step, the circuit pattern 131 and a solder resist layer 140 for protecting the circuit pattern 131, etc. are formed on top of the outermost inner layer 130. Also, an align pattern region X is formed through mechanical or chemical processing. The align pattern region X, as a pattern that has a height less than the surface of the outermost layer of the optical printed circuit board, may be formed by performing a mechanical or chemical process. Also, during the processing, the surfaces of the optical transmitting portion Tx and the optical receiving portion Tr at the ends of the optical connecting module 100 are exposed.

Then, the align pattern region X is made to be an auto aligning point for mounting using the transmitting module or receiving module, and at least a portion of the transmitting module or receiving module is embedded in the align pattern region X in step S4.

Accordingly, the optical printed circuit board according to embodiments reduces the possibility of the transmitting module or receiving module being separated or damaged from external shock, and can reduce noise when signals are relayed, due to more firm fixing of the transmitting module or receiving module.

Figure 6:
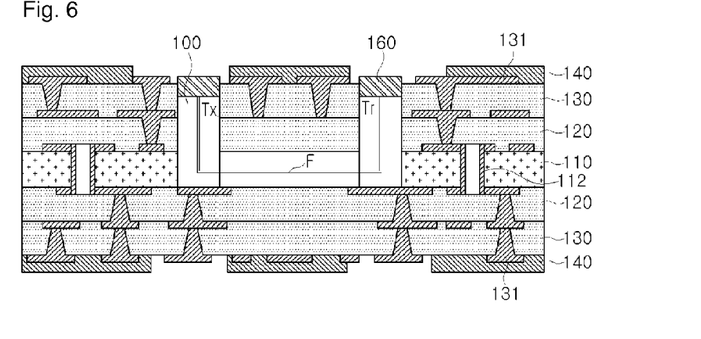
FIGS. 6 through 8 are sectional views schematically showing main elements of an optical printed circuit board according to other embodiments.
Figure 7:
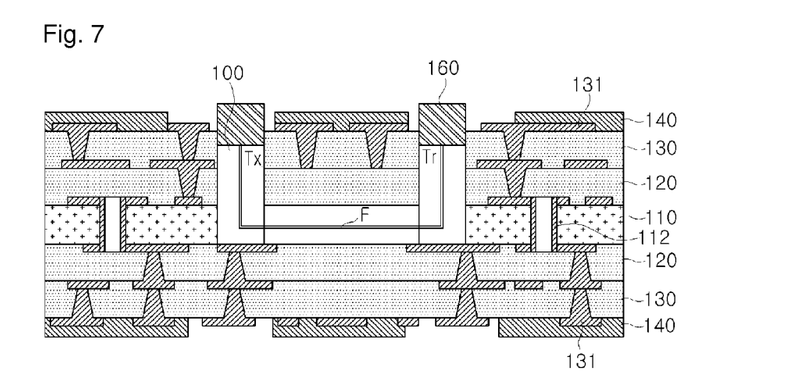
Figure 8:
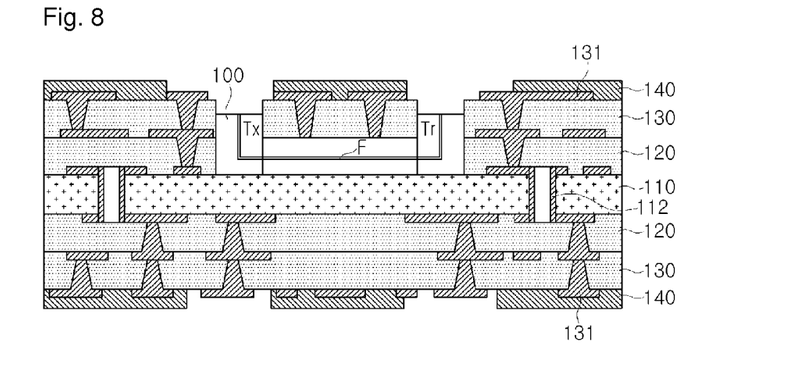

FIGS. 6 through 8 are sectional views schematically showing main elements of an optical printed circuit board according to other embodiments.

Referring to the embodiment of FIG. 6 in which a different structure of an optical connecting module 100 is shown, a portion of the block structure forming the optical transmitting portion Tx and optical receiving portion Tr is inserted up to the base inner layer 110, and an optical waveguide F is formed to connect both blocks. The transmitting module or the receiving module 160 at the upper portion of the optical connecting module 100 may be formed lower than the surface of the optical printed circuit board.

Referring to the embodiment of FIG. 7 in which another structure of an optical connecting module 100 is shown, a portion of a block structure forming the optical transmitting portion Tx and optical receiving portion Tr is inserted up to the base inner layer 110, and an optical waveguide F is formed connecting both blocks. A portion of a transmitting module or receiving module 160 at the top of the optical connecting module 100 may be formed higher than the surface of the optical printed circuit board.

Referring to the embodiment in FIG. 8 in which another structure of an optical connecting module 100 is shown, a portion of a block structure forming the optical transmitting portion Tx and the optical receiving portion Tr is not inserted up to the base inner layer 110 and is inserted in an inner layer 120 disposed atop the base inner layer 110, and an optical waveguide F is formed connecting both blocks. Of course, a portion of a transmitting module or receiving module 160 at the top of the optical connecting module 100 may be formed higher than the surface of the optical printed circuit board, and a portion of the transmitting module or receiving module 160 may be formed lower than the surface of the optical printed circuit board.

While the present invention has been described and illustrated herein with reference to preferred embodiments thereof, such description is merely exemplary and does not limit the present invention, and it will be apparent to those having ordinary skill in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

Embodiments can be applied to an optical printed circuit board, and a method for manufacturing the same.

The invention claimed is:

1. An optical printed circuit board comprising:
    a printed circuit board provided with at least one or more inner layers, and a circuit pattern electrically connecting the inner layers;
    an optical connecting module embedded in the printed circuit board and including an optical transmitting portion, an optical receiving portion, and an optical waveguide connecting the optical transmitting portion and the optical receiving portion; and
    a transmitting module and a receiving module both inserted in an align pattern region and connected to the optical connecting module;
    wherein the printed circuit board defines the align pattern region such that a top surface of the optical transmitting portion or the optical receiving portion is formed lower than a surface of the printed circuit board, and
    wherein the transmitting module and the receiving module are connected through the optical connecting module and a guide pin.

2. The optical printed circuit board according to claim 1, wherein the align pattern region is formed as at least one recessed pattern that is lower than an outermost surface of the printed circuit board.

3. The optical printed circuit board according to claim 1, wherein the align pattern region has a depth extending from an outermost surface of the printed circuit board to a portion of an outermost inner layer among the at least one or more inner layers.

4. The optical printed circuit board according to claim 1, wherein the transmitting module includes an E/O (Electro Optical) converter, and the receiving module includes an O/E (Optical Electro) converter.

5. The optical printed circuit board according to claim 1, wherein at least a portion of the transmitting module or a portion of the receiving module is disposed lower than the surface of the printed circuit board.

6. A method for manufacturing an optical printed circuit board, the method comprising:
    a first step of forming a base inner layer on an insulation layer, the base inner layer having a circuit pattern formed thereon;
    a second step of processing the base inner layer or an inner layer on the base inner layer, and positioning an optical connecting module in a defined cavity;
    a third step of forming at least one or more electrically interconnected inner layers on a region other than the optical connecting module;
    a fourth step of selectively removing a surface of an outermost inner layer from among the at least one or more inner layers, and forming an align pattern region; and
    a fifth step of forming a transmitting module and a receiving module that are both inserted in the align pattern, aligned with the optical connecting module and mounted on the optical connecting module,
    wherein the transmitting module and the receiving module are connected through the optical connecting module and a guide pin.

7. The method according to claim 6, wherein in the second step, the cavity is defined using a pattern forming method using mechanical processing or chemical processing of the base inner layer or the inner layer on the base inner layer.

8. The method according to claim 6, wherein the third step includes forming the outermost inner layer among the at least one or more inner layers to be greater in height than the optical connecting module.

9. The method according to claim 6, wherein the align pattern region is a recessed pattern provided in a stepped structure to be lower than a surface of an outermost inner layer from among the at least one or more inner layers.

10. The method according to claim 6, wherein the align pattern region is formed using a mechanical process or a chemical process.

11. The method according to claim 6, wherein the align pattern region is formed such that a portion of a surface of the optical connecting module is exposed.

12. The method according to claim 6, wherein the align pattern region is formed as a region stepped to be lower than a surface of an outermost inner layer among the at least one or more inner layers.

* * * * *